(12) United States Patent
Kaslusky et al.

(10) Patent No.: US 8,331,091 B2
(45) Date of Patent: Dec. 11, 2012

(54) ELECTRONICS PACKAGE WITH RADIAL HEAT SINK AND INTEGRATED BLOWER

(75) Inventors: Scott F. Kaslusky, West Hartford, CT (US); Brian St. Rock, Andover, CT (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 162 days.

(21) Appl. No.: 12/873,508

(22) Filed: Sep. 1, 2010

(65) Prior Publication Data

US 2012/0050990 A1 Mar. 1, 2012

(51) Int. Cl.
*H05K 7/20* (2006.01)

(52) U.S. Cl. ....... 361/695; 361/697; 165/80.3; 165/121; 165/185

(58) Field of Classification Search .................. None
See application file for complete search history.

(56) References Cited

U.S. PATENT DOCUMENTS

| | | | |
|---|---|---|---|
| 6,167,952 B1 | 1/2001 | Downing | |
| 6,213,195 B1 | 4/2001 | Downing et al. | |
| 6,278,353 B1 | 8/2001 | Downing et al. | |
| 6,348,748 B1 * | 2/2002 | Yamamoto | 310/62 |
| 6,659,169 B1 * | 12/2003 | Lopatinsky et al. | 165/121 |
| 7,055,581 B1 * | 6/2006 | Roy | 165/104.33 |
| 7,164,584 B2 | 1/2007 | Walz | |
| 7,277,280 B2 * | 10/2007 | Peng | 361/695 |
| 7,458,415 B2 * | 12/2008 | Hashimoto et al. | 165/80.3 |
| 7,583,502 B2 * | 9/2009 | Tsao et al. | 361/697 |
| 7,684,187 B1 * | 3/2010 | Meyer et al. | 361/679.47 |
| 7,724,522 B2 * | 5/2010 | Lan | 361/695 |
| 7,775,062 B2 | 8/2010 | Blomquist | |
| 7,787,247 B2 * | 8/2010 | Han | 361/679.47 |
| 7,796,389 B2 | 9/2010 | Edmunds et al. | |
| 7,843,691 B2 * | 11/2010 | Reichert et al. | 361/695 |
| 7,880,283 B2 | 2/2011 | Zhuang | |
| 7,929,302 B2 * | 4/2011 | Chuang | 361/695 |
| 7,969,733 B1 * | 6/2011 | Abbay et al. | 361/695 |
| 2007/0119205 A1 | 5/2007 | Zywiak et al. | |
| 2008/0130226 A1 * | 6/2008 | Yamashita et al. | 361/695 |
| 2010/0170657 A1 | 7/2010 | Kaslusky | |
| 2011/0222243 A1 * | 9/2011 | Nagami et al. | 361/697 |

\* cited by examiner

*Primary Examiner* — Boris Chervinsky
(74) *Attorney, Agent, or Firm* — Cantor Colburn LLP

(57) ABSTRACT

According to one aspect of the invention, an electronics package includes an enclosure and one or more thermal energy generating components disposed in the enclosure. A radial heat sink is disposed in the enclosure including a blower disposed in the radial heat sink and a plurality of fins extending from a periphery of the blower toward a perimeter of the radial heat sink. The plurality of fins define a plurality of channels having a plurality of channel exits at the perimeter of the radial heat sink. The radial heat sink configured to dissipate thermal energy from the one or more components which are arranged around the heat sink according to heat flux requirements of each component. An air inlet extends through the enclosure and is connected to the blower to direct air to the blower in a direction substantially perpendicular to the first longitudinal face and/or the second longitudinal face.

25 Claims, 2 Drawing Sheets

ELECTRONICS PACKAGE WITH RADIAL HEAT SINK AND INTEGRATED BLOWER

FEDERAL RESEARCH STATEMENT

This invention was made with Government support under United States Government contract W31P4Q-09-C-0067 awarded by the U.S. Army. The Government has certain rights in the invention.

BACKGROUND OF THE INVENTION

The subject matter disclosed herein relates to cooling of electronic components. More specifically, the subject disclosure relates to heat sink configurations for packaged electronics.

To facilitate packaging, electronics devices are typically contained within rectangular enclosures. The electronics devices contained in the rectangular enclosures may be air-cooled or liquid-cooled depending on the application. In some applications, for example, power conversion electronics packages, cooling is often accomplished via a cold plate. Cold plates typically include a number of channels through which a liquid cooling medium is circulated. Electronics components such as switches, filters, transformers and inductors are located along either face of the cold plate. Heat generated by the components is conducted to the cold plate and transferred to the cooling medium.

For such power conversion electronics, liquid cooling is typically used. Air cooling of similar cold plate structures typically requires very dense fin structures causing large pressure drops and parallel flow networks resulting in high flow rates. In such cases, airflow is typically pressurized by an externally-located (to the enclosure) fan and ducted into the electronics enclosure. The high flow rates and high pressure drop required results in fan power requirements that typically greatly exceed that of liquid cooling systems having equivalent cooling capacity.

BRIEF DESCRIPTION OF THE INVENTION

According to one aspect of the invention, an electronics package includes an enclosure and one or more thermal energy generating components disposed in the enclosure. A radial heat sink is disposed in the enclosure including a blower disposed in the radial heat sink and a plurality of fins extending from a periphery of the blower toward a perimeter of the radial heat sink. The plurality of fins define a plurality of channels having a plurality of channel exits at the perimeter of the radial heat sink. The radial heat sink is configured to dissipate thermal energy from the one or more components which are arranged around the heat sink according to heat flux requirements of each component. An air inlet extends through the enclosure and is connected to the blower to direct air to the blower in a direction substantially perpendicular to the first longitudinal face and/or the second longitudinal face.

According to another aspect of the invention, a method of dissipating thermal energy from an electronics package includes locating a radial heat sink in an enclosure of the electronics package. The radial heat sink includes a blower and a plurality of fins extending from a periphery of the blower toward a perimeter of the radial heat sink. The plurality of fins defining a plurality of channels having a plurality of channel exits at the perimeter of the radial heat sink. The radial heat sink defines one or more areas of relatively high heat flux capacity and one or more areas of relatively low heat flux capacity. An air inlet extends through the enclosure and is connected to the blower to direct air to the blower in a direction substantially perpendicular to the first longitudinal face and/or the second longitudinal face. One or more thermal energy generating components are located in the enclosure about the radial heat sink, according to heat flux requirements of each component. The blower is operated to urge a flow of air through air inlet toward the plurality of channels thereby dissipating thermal energy from the one or more components.

These and other advantages and features will become more apparent from the following description taken in conjunction with the drawings.

BRIEF DESCRIPTION OF THE DRAWINGS

The subject matter, which is regarded as the invention, is particularly pointed out and distinctly claimed in the claims at the conclusion of the specification. The foregoing and other features, and advantages of the invention are apparent from the following detailed description taken in conjunction with the accompanying drawings in which:

The detailed description explains embodiments of the invention, together with advantages and features, by way of example with reference to the drawings.

DETAILED DESCRIPTION OF THE INVENTION

Figure 1:
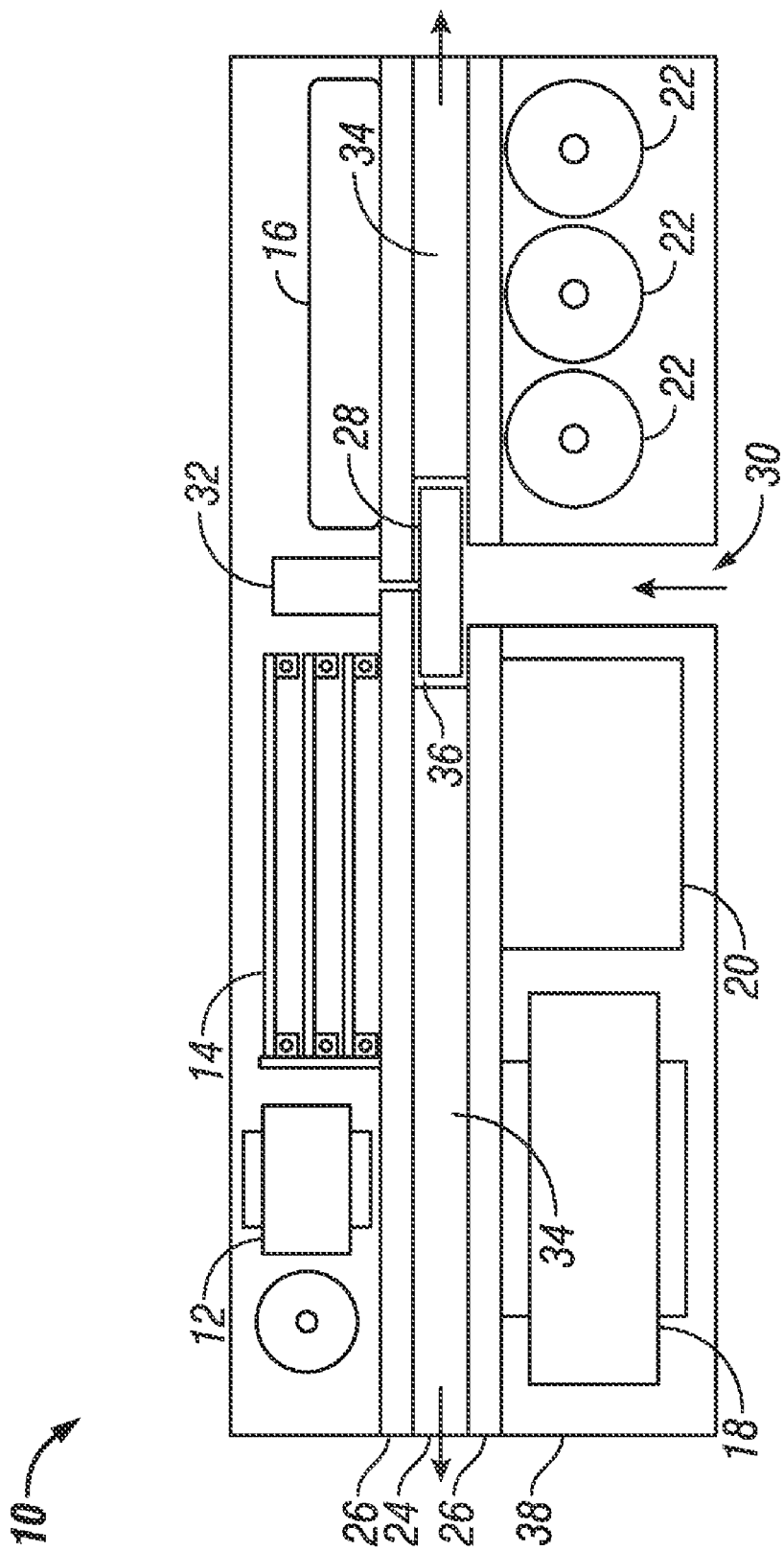
FIG. 1 is a schematic view of an embodiment of an electronics package including a radial heat sink.

Shown in FIG. 1 is a schematic view of an electronics package 10, for example, a power conversion electronics package including an enclosure 50. The enclosure 50 of FIG. 1 is substantially rectangular, but it is to be appreciated that other enclosure shapes may be employed, for example, square, or triangular or irregular. The electronics package 10 includes one or more heat-producing electronics components located in the enclosure 50, for example, input filter 12, control boards 14, power switches 16, transformer 18, output filter inductors 20, and/or output filter caps 22. The components are located at a heat sink 24, disposed in the enclosure 50. In some embodiments, the heat sink 24 is located in the enclosure 50 with the components located at either or both longitudinal faces 26 of the heat sink 24.

The heat sink 24 includes a centrifugal blower 28 located between the longitudinal faces 26 of the heat sink 24. An air inlet 30 extends through the enclosure 50 and one or both of the longitudinal faces 26 to provide airflow to the blower 28. The air inlet 30 is configured to direct air into through the air inlet 30 substantially perpendicular to the longitudinal faces 26 of the heat sink 24. The blower 28 is driven by a motor 32 which, in some embodiments, is located at the heat sink 24. A plurality of fins 34 extend between the longitudinal faces 26, from one longitudinal face 26 toward the other longitudinal face 26 and extend outwardly from a periphery 36 of the blower 28 toward a perimeter 38 of the heat sink 24. In some embodiments, one or more components to be cooled are located at the same longitudinal face 26 through which the air inlet 30 extends.

Figure 2:
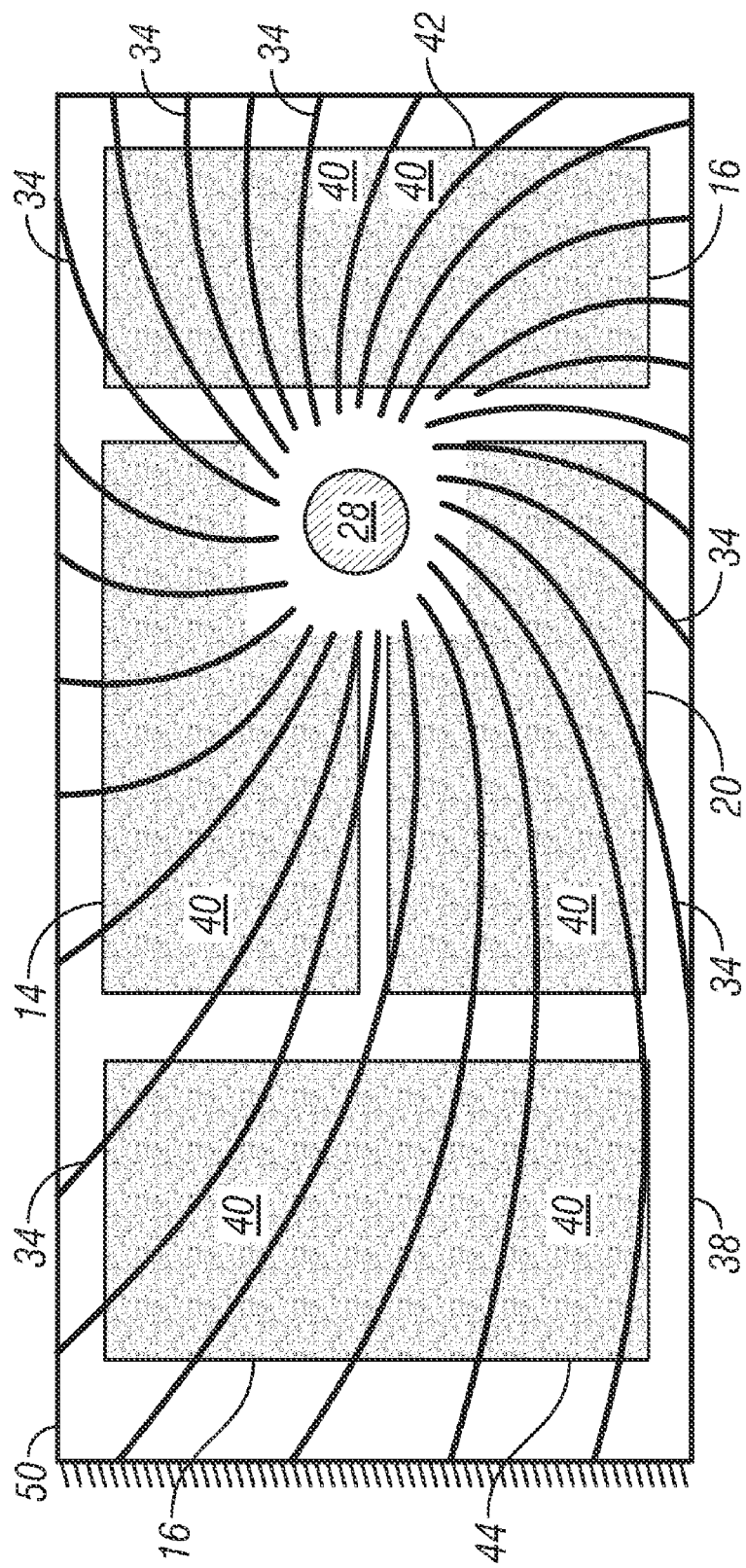
FIG. 2 is a plan view of an embodiment of an electronics package including a radial heat sink.

Referring now to FIG. 2, the plurality of fins 34 define a plurality of channels 40, with each channel 40 defined by adjacent fins 34 of the plurality of fins 34. Air enters the enclosure 50 through the air inlet 30 (shown in FIG. 1) and is pressurized by the blower 28 and flows through the plurality of channels 40 toward the perimeter 38 of the heat sink 24. In some embodiments, the blower 28 has an outlet an outlet in plane with the longitudinal faces 26 and a direction of the plurality of fins 34 at the entrance to the plurality of channels 40 channels is substantially aligned with the direction of airflow leaving the blower 28. Further, in some embodiments, to increase efficiency of the heat sink 24 and to reduce losses, an average velocity of the air flow at the channel entrances is substantially equal for each channel 40 of the plurality of channels 40, and the total pressure drop from each channel entrance, at the blower 28, to each channel exit, at the perimeter 38, is also substantially equal for each channel 40 of the plurality of channels 40.

The electronic components 12, 14, 16, 18, 20, and/or 22 each have unique cooling, or heat flux requirements based on the amount of thermal energy produced during operation that must be dissipated. Thus a position of the blower 28 in the enclosure 50 and/or a density of the plurality of fins 34 can be adjusted to provide improved cooling for each of the electronic components. For example, the blower 28 may be positioned at an off-center location in the enclosure 50 as shown in FIG. 2. This defines a first area 42 of relatively short channels 40 which results in a relatively low thermal resistance, or higher heat flux capacity, and a second area 44 of relatively long channels 40 which results in relatively high thermal resistance, or lower heat flux capacity. In arranging the components in the enclosure 50, those which have greater heat flux requirements, such as the power switches 16 and the output filter caps 22, are placed at the first area 42. Those components that have lower heat flux requirements, such as the input filter 12, control boards 14, transformer 18, and output filter inductors 20 are placed at the second area 44. To provide additional cooling flexibility, fin 34 densities in the first area 42 and/or the second area 44 may be adjusted. Increasing the fin 34 density by, for example, placing fins closer together or increases the heat flux capacity, or decreases the thermal resistance, of the area where the fin 34 density is increased. Similarly, decreasing the fin 34 density in a given area decreases the heat flux capacity of that area. These adjustments may be made locally, for example, in an area specific to a single component, or more globally, for example, throughout an entire first area 42 or second area 44. In some embodiments, the fin 34 density is varied to provide a substantially uniform pressure drop through the plurality of channels 40 to improve efficiency of the radial heat sink 24. To achieve this, in areas having longer channels 40, a channel 40 width may be greater, while in areas having shorter channels 40, a channel 40 width may be smaller with the fins 34 spaced more closely than in areas having longer channels 40.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. An electronics package comprising:
    an enclosure;
    one or more thermal energy generating components disposed in the enclosure;
    a radial heat sink having a first and second longitudinal face disposed in the housing including:
       a blower disposed in the radial heat sink; and
       a plurality of fins disposed between the first longitudinal face and second longitudinal face and extending from a periphery of the blower toward a perimeter of the radial heat sink, the plurality of fins defining a plurality of channels having a plurality of channel exits at the perimeter of the radial heat sink, the radial heat sink configured to dissipate thermal energy from the one or more components, the one or more components arranged around the radial heat sink according to heat flux requirements of each component; and
    an air inlet extending through the enclosure and connected to the blower to direct air to the blower in a direction substantially perpendicular to the first longitudinal face and/or the second longitudinal face.

2. The electronics package of claim 1, wherein the one or more components are disposed at both the first longitudinal face and the second longitudinal face.

3. The electronics package of claim 1, wherein one or more components are disposed at a same longitudinal face as the air inlet.

4. The electronics package of claim 1, wherein the blower is a centrifugal blower, wherein the direction of the plurality of fins at an entrance to the plurality of channels is substantially aligned with the direction of the airflow leaving the centrifugal blower.

5. The electronics package of claim 4, wherein the blower has an inlet substantially perpendicular to the first and/or second longitudinal faces and an outlet in plane of the first and/or second longitudinal faces.

6. The electronics package of claim 1, wherein the radial heat sink includes one or more areas of relatively high heat flux capacity and one or more areas of relatively low heat flux capacity.

7. The electronics package of claim 1, wherein the blower is positioned off center in the radial heat sink, defining one or more areas of relatively long channels and one or more areas of relatively short channels.

8. The electronics package of claim 7, wherein heat flux capacity decreases as a length of the channels increases.

9. The electronics package of claim 1, wherein a fin density is varied to define areas of relatively high heat flux capacity and areas of relatively low heat flux capacity.

10. The electronics package of claim 9, wherein heat flux capacity increases as fin density increases.

11. The electronics package of claim 9, wherein components having relatively high heat flux requirements are disposed at the one or more areas of relatively high heat flux capacity.

12. The electronics package of claim 9, wherein components having relatively low heat flux requirements are disposed at the one or more areas of relatively low heat flux capacity.

13. The electronics package of claim 1, wherein a total pressure drop through the channel to the channel exit is substantially equal for each channel of the plurality of channels.

14. The electronics package of claim 13, wherein a width of the plurality of channels is varied to equalize the total pressure drop.

15. The electronics package of claim 14, wherein the width of the plurality of channels is varied depending on a length of each channel to equalize the total pressure drop.

16. A method of dissipating thermal energy from an electronics package comprising:
    locating a radial heat sink in an enclosure of the electronics package, the radial heat sink including:
       a blower disposed in the radial heat sink;

a plurality of fins extending from a periphery of the blower toward a perimeter of the radial heat sink, the plurality of fins defining a plurality of channels having a plurality of channel exits at the perimeter of the radial heat sink, the radial heat sink defining one or more areas of relatively high heat flux capacity and one or more areas of relatively low heat flux capacity; and an air inlet extending through the enclosure and connected to the blower to direct air to the blower in a direction substantially perpendicular to the first longitudinal face and/or the second longitudinal face locating one or more thermal energy generating components in the enclosure about the heat sink, according to heat flux requirements of each component;

operating the blower to urge a flow of air from the air inlet through the plurality of channels thereby dissipating thermal energy from the one or more components.

17. The method of claim 16, further positioning components having relatively high heat flux requirements at areas of relatively high heat flux capacity.

18. The method of claim 16, further comprising positioning components having relatively low heat flux requirements at areas of relatively low heat flux capacity.

19. The method of claim 16, comprising positioning the blower off center in the radial heat sink, thereby defining one or more areas of relatively long channels and one or more areas of relatively short channels.

20. The method of claim 19, wherein heat flux capacity decreases as a length of the channels increases.

21. The method of claim 16, further comprising varying a fin density to define areas of relatively high heat flux capacity and areas of relatively low heat flux capacity.

22. The method of claim 21, wherein heat flux capacity increases as fin density increases.

23. The method of claim 16, including substantially equalizing a total pressure drop through the channel to the channel exit for each channel of the plurality of channels.

24. The method of claim 23 wherein a width of the plurality of channels is varied to equalize the total pressure drop.

25. The method of claim 24, wherein the width of the plurality of channels is varied depending on a length of each channel to equalize the total pressure drop.

* * * * *